United States Patent
Yun et al.

(10) Patent No.: US 8,228,104 B2
(45) Date of Patent: Jul. 24, 2012

(54) DUTY CYCLE CORRECTING CIRCUIT AND METHOD OF CORRECTING A DUTY CYCLE

(75) Inventors: Won-Joo Yun, Ichon (KR); Hyun-Woo Lee, Ichon (KR)

(73) Assignee: SK hynix Inc. (KR)

( * ) Notice: Subject to any disclaimer, the term of this patent is extended or adjusted under 35 U.S.C. 154(b) by 134 days.

(21) Appl. No.: 12/345,480

(22) Filed: Dec. 29, 2008

(65) Prior Publication Data

US 2009/0295446 A1    Dec. 3, 2009

(30) Foreign Application Priority Data

May 30, 2008  (KR) .................. 10-2008-0051064

(51) Int. Cl.
*H03K 3/017* (2006.01)
*H03K 5/04* (2006.01)
*H03K 7/08* (2006.01)

(52) U.S. Cl. ........................................ 327/175
(58) Field of Classification Search ........... 327/108–112
See application file for complete search history.

(56) References Cited

U.S. PATENT DOCUMENTS

| | | | |
|---|---|---|---|
| 6,967,514 B2 * | 11/2005 | Kizer et al. ................... 327/175 | |
| 7,183,824 B2 | 2/2007 | Park et al. | |
| 7,206,956 B2 | 4/2007 | Johnson et al. | |
| 7,360,135 B2 * | 4/2008 | Boerstler et al. ............. 714/733 | |
| 7,369,457 B2 | 5/2008 | Tokiwa | |
| 2004/0189364 A1 | 9/2004 | Lee et al. | |
| 2009/0115347 A1 | 5/2009 | Nakao et al. | |

FOREIGN PATENT DOCUMENTS

| | | |
|---|---|---|
| JP | 08-147967 | 6/1996 |
| KR | 1020050055925 A | 6/2005 |
| KR | 1020080069756 A | 7/2008 |
| KR | 1020080092494 A | 10/2008 |
| KR | 1020080092496 A | 10/2008 |

* cited by examiner

*Primary Examiner* — Lincoln Donovan
*Assistant Examiner* — Daniel Rojas
(74) *Attorney, Agent, or Firm* — Baker & McKenzie LLP (57) ABSTRACT

A duty cycle correcting circuit includes a duty ratio control unit configured to alternately change logical values of a plurality of bits of a pull-up control signal and a plurality of bits of a pull-down control signal in response to a duty ratio detection signal, a duty ratio correcting unit configured to adjust driving abilities of a first driver and a second driver in response to the plurality of bits of the pull-up control signal and the plurality of bits of the pull-down control signal to output a correction clock signal, and a duty ratio detecting unit configured to detect a duty ratio of the correction clock to generate the duty ratio detection signal.

14 Claims, 5 Drawing Sheets

FIG.5

DUTY CYCLE CORRECTING CIRCUIT AND METHOD OF CORRECTING A DUTY CYCLE

CROSS-REFERENCES TO RELATED PATENT APPLICATION

The present application claims priority under 35 U.S.C. 119(a) to Korean Application No. 10-2008-0051064, filed on May 30, 2008, in the Korean Intellectual Property Office, which is incorporated herein by reference in its entirety as if set forth in full.

BACKGROUND

1. Technical Field

The embodiment described herein relate to a semiconductor integrated circuit (IC) apparatus and a method thereof and, more particularly, to a duty cycle correcting circuit included in a semiconductor IC apparatus and a method of correcting a duty cycle of a clock signal.

2. Related Art

In general, semiconductor IC apparatuses, such as synchronous dynamic random access memory (SDRAM) apparatus, have increased operational speeds by operating using clock signals. For example, a semiconductor IC apparatus includes a clock buffer and buffers an external clock signal to use it inside. In some cases, the semiconductor IC apparatus uses a delay locked loop (DLL) circuit or a phase locked loop (PLL) circuit to generate and use an internal clock signal where a phase difference with the external clock signal is corrected. In the internal clock signal used in the semiconductor IC apparatus, a ratio between a high level interval and a low level interval, i.e., a duty ratio, is preferably maintained at a predetermined ratio of 50:50. However, since the semiconductor IC apparatus includes numerous delay elements, the duty ratio of the internal clock signal may easily vary.

Due to the high-speed operations of semiconductor IC apparatuses, utilization of a clock signal has increased, wherein a clock having a stable duty ratio is required. Accordingly, each semiconductor IC apparatus includes a duty cycle correcting circuit to stabilize a duty ratio of a clock signal. The duty cycle correcting circuit becomes increasingly important to utilize a stable clock signal during high speed operation of the semiconductor IC apparatus.

Types of duty cycle correcting circuits may be classified into analog-type and digital-type. The digital-type duty cycle correcting circuit is advantageous in terms of low use of occupied area of the semiconductor IC apparatus and high operational speeds. The digital-type duty cycle correcting circuit includes multi-stage drivers, and changes driving abilities of the drivers in response to a digital code, and adjusts a duty ratio of a clock signal. For example, in a two-stage driver, a driving ability of a pull-up section of a driver of a first stage and a driving ability of a pull-down section of a driver of a second stage are adjusted, thereby changing a width of a low level interval of a clock signal. Accordingly, the digital code is a signal that is generated by generating a binary code using a general counter and decoding the binary code. Thus, when a logical value of the digital code is changed, the driving abilities of the individual drivers of the two stages are sequentially changed.

The duty cycle correcting circuit is configured such that a driving ability of one of a plurality of drivers is first changed in response to the digital code, and driving abilities of the other drivers are also changed. For example, the duty cycle correcting circuit is operated such that the pull-up section of the driver of the first stage and the pull-down section of the driver of the second stage are set to have maximum driving abilities on the basis of a default value of the digital code, and the driving ability of the pull-up section of the driver of the first stage is gradually decreased and minimized. In addition, the driving ability of the pull-down section of the driver of the second stage is gradually decreased and minimized, when the digital code is changed. However, if the driving ability of the pull-up section of the driver of the first stage is minimized, then the driving ability of the entire driver of the first stage is decreased, and a fan-out difference increases between the drivers of the two stages. As a result, all of the drivers can be erroneously operated. That is, the duty cycle correcting circuit is designed in consideration of only a duty cycle correction operation without considering fan-out between the drivers. For this reason, stability of the operation is lowered.

SUMMARY

A duty cycle correcting circuit and method of correcting a duty cycle that can implement a stable duty cycle correction operation are disclosed herein.

In one aspect, a duty cycle correcting circuit includes a duty ratio control unit configured to alternately change logical values of a plurality of bits of a pull-up control signal and a plurality of bits of a pull-down control signal in response to a duty ratio detection signal, a duty ratio correcting unit configured to adjust driving abilities of a first driver and a second driver in response to the plurality of bits of the pull-up control signal and the plurality of bits of the pull-down control signal to output a correction clock signal, and a duty ratio detecting unit configured to detect a duty ratio of the correction clock to generate the duty ratio detection signal.

In another aspect, a duty cycle correcting circuit includes a counting unit configured to generate a plurality of bits of a counting signal whose logical value increases in a predetermined unit, a decoding unit configured to change a logical value of one of a plurality of bits of a pull-up control signal and a plurality of bits of a pull-down control signal in accordance with a logical value of a least significant bit of the plurality of bits of the counting signal, and a duty ratio correcting unit configured to adjust driving abilities of a first driver and a second driver in response to the plurality of bits of the pull-up control signal and the plurality of bits of the pull-down control signal to output a correction clock signal.

In another aspect, a duty cycle correction method that corrects a duty cycle in a duty cycle correcting circuit, that includes first and second drivers connected in series, and corrects a duty ratio of an input clock signal to generate a correction clock signal, the method includes detecting a duty ratio of the correction clock signal to generate a duty ratio detection signal, changing a driving ability of the first driver in response to the duty ratio detection signal to correct the duty ratio of the correction clock signal, detecting the duty ratio of the correction clock signal to generate the duty ratio detection signal, and changing a driving ability of the second driver in response to the duty ratio detection signal to correct the duty ratio of the correction clock signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
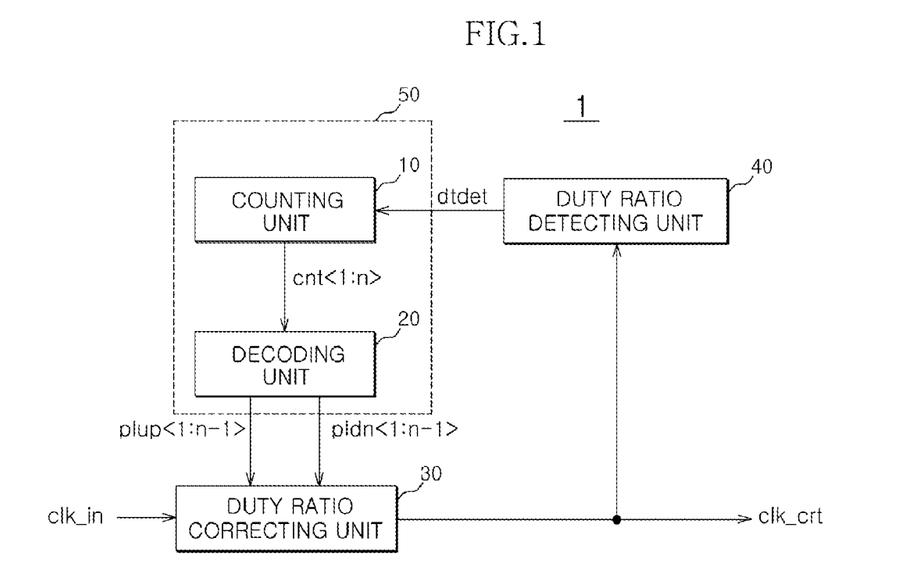
FIG. 1 is a schematic block diagram of an exemplary duty cycle correcting circuit apparatus according to one embodiment.

FIG. 1 is a schematic block diagram of an exemplary duty cycle correcting circuit apparatus according to one embodiment. In FIG. 1, the duty cycle correcting circuit 1 can be configured to include a counting unit 10, a decoding unit 20, a duty ratio correcting unit 30, and a duty ratio detecting unit 40.

The counting unit 10 can generate n-bits of a counting signal 'cnt<1:n>' in response to a duty ratio detection signal 'dtdet'. The duty ratio detection signal 'dtdet' can be enabled when a low level interval of a correction clock signal 'clk_crt' that can be wider than a high level interval thereof. The counting unit 10 can be operated when the duty ratio detection signal 'dtdet' is enabled. In the n-bits of the counting signal 'cnt<1:n>' that are generated when the counting unit 10 is operated, a logical value thereof can increase in a predetermined unit, for example, a "1". When the duty ratio detection signal 'dtdet' is disabled, the counting unit 10 can lock the logical value of the n-bits of the counting signal 'cnt<1:n>'.

The decoding unit 20 can decode the n-bits of the counting signal 'cnt<1:n>' to generate (n−1)-bits of a pull-up control signal 'plup<1:n−1>' and (n−1)-bits of a pull-down control signal 'pldn<1:n−1>'. In addition, the decoding unit 20 can determine a logical value of a least significant bit of the n-bits of the counting signal 'cnt<1:n>', and can then change a logical value of the (n−1)-bits of the pull-up control signal 'plup<1:n−1>' or a logical value of the (n−1)-bits of the pull-down control signal 'pldn<1:n−1>'. For example, when the logical value of the least significant bit of the n-bits of the counting signal 'cnt<1:n>' is "0", the decoding unit 20 can change the logical value of the (n−1)-bits of the pull-up control signal 'plup<1:n−1>' by "1". When the logical value of the least significant bit of the n-bits of the counting signal 'cnt<1:n>' is "1", the decoding unit 20 can change the logical value of the (n−1)-bits of the pull-down control signal pldn'<1:n−1>' by "1".

The n-bits of the counting signal 'cnt<1:n>' can be generated when the counting unit 10 changes the logical value in a unit of "1", and thus the logical value of the least significant bit of the n-bits of the counting signal 'cnt<1:n>' alternately has a value of "0" or "1". Thus, the logical value of the (n−1)-bits of the pull-up control signal 'plup<1:n−1>' and the logical value of the (n−1)-bits of the pull-down control signal 'pldn<1:n−1>' can be alternately changed. In this case, the decoding unit 20 can determine the logical value of the least significant value of the n-bits of the counting signal 'cnt<1:n>'. The decoding unit 20 can also determine a logical value of the second low bit.

The duty ratio correcting unit 30 can correct a duty ratio of an input clock signal 'clk_in' in response to the logical value of the (n−1)-bits of the pull-up control signal 'plup<1:n−1>' and the logical value of the (n−1)-bits of the pull-down control signal 'pldn<1:n−1>' to output a correction clock signal 'clk_crt'.

The duty ratio correcting unit 30 can be configured to include multi-stage drivers, which will be described in detail below. The duty ratio correcting unit 30 can use first and second drivers that are connected in series and can correct the duty ratio of the input clock signal 'clk_in' to output the correction clock signal 'clk_crt'. Here, each of the first driver and the second driver can includes a pull-up section and a pull-down section.

A driving ability of the pull-up section of the first driver can change in response to the (n−1)-bits of the pull-up control signal 'plup<1:n−1>' and a driving ability of the pull-down section of the second driver changes in response to the (n−1)-bits of the pull-down control signal 'pldn<1:n−1>'. The (n−1)-bits of the pull-up control signal 'plup<1:n−1>' can be input to the pull-up section of the second driver, and the (n−1)-bits of the pull-down control signal 'pldn<1:n−1>' can be input to the pull-down section of the first driver.

As described above, the logical value of the (n−1)-bits of the pull-up control signal 'plup<1:n−1>' and the logical value of the (n−1)-bits of the pull-down control signal 'pldn<1:n−1>' can alternately change by "1". Accordingly, the driving ability of the pull-up section of the first driver that is operated in response to the (n−1)-bits of the pull-up control signal 'plup<1:n−1>' and the driving ability of the pull-down section of the second driver that is operated in response to the logical value of the (n−1)-bits of the pull-down control signal 'pldn<1:n−1>' can be alternately changed. Accordingly, the pull-up section of the first driver and the pull-down section of the second driver can alternately change their driving abilities. Thus, a fan-out difference between the first driver and the second driver can be configured to not exceed a predetermined range, thereby improving stability of the operation.

The duty ratio detecting unit 40 can detect a duty ratio of the correction clock signal 'clk_crt' to generate the duty ratio detection signal 'dtdet'. At the time of an initial operation of the duty cycle correcting circuit 1, a first interval, i.e., a low level interval, of the correction clock signal 'clk_crt' can be wider than a second interval, i.e., a high level interval. If the first interval of the correction clock signal 'clk_crt' is not significantly wider than the second interval thereof while the above-described duty cycle correction operation is performed, then the duty ratio detecting unit 40 can disable the duty ratio detection signal 'dtdet', and the duty cycle correcting circuit 1 can stop changing the duty cycle of the correction clock signal 'clk_crt'. The structure of the duty ratio detecting unit 40 can include a duty accumulator, for example.

In FIG. 1, the counting unit 10 and the decoding unit 20 can be denoted as a duty ratio control unit 50. For example, the duty ratio control unit 50 can alternately change the logical value of the (n−1)-bits of the pull-up control signal 'plup<1:n−1>' and the logical value of the (n−1)-bits of the pull-down control signal 'pldn<1:n−1>' in response to the duty ratio detection signal 'dtdet'.

Figure 2:
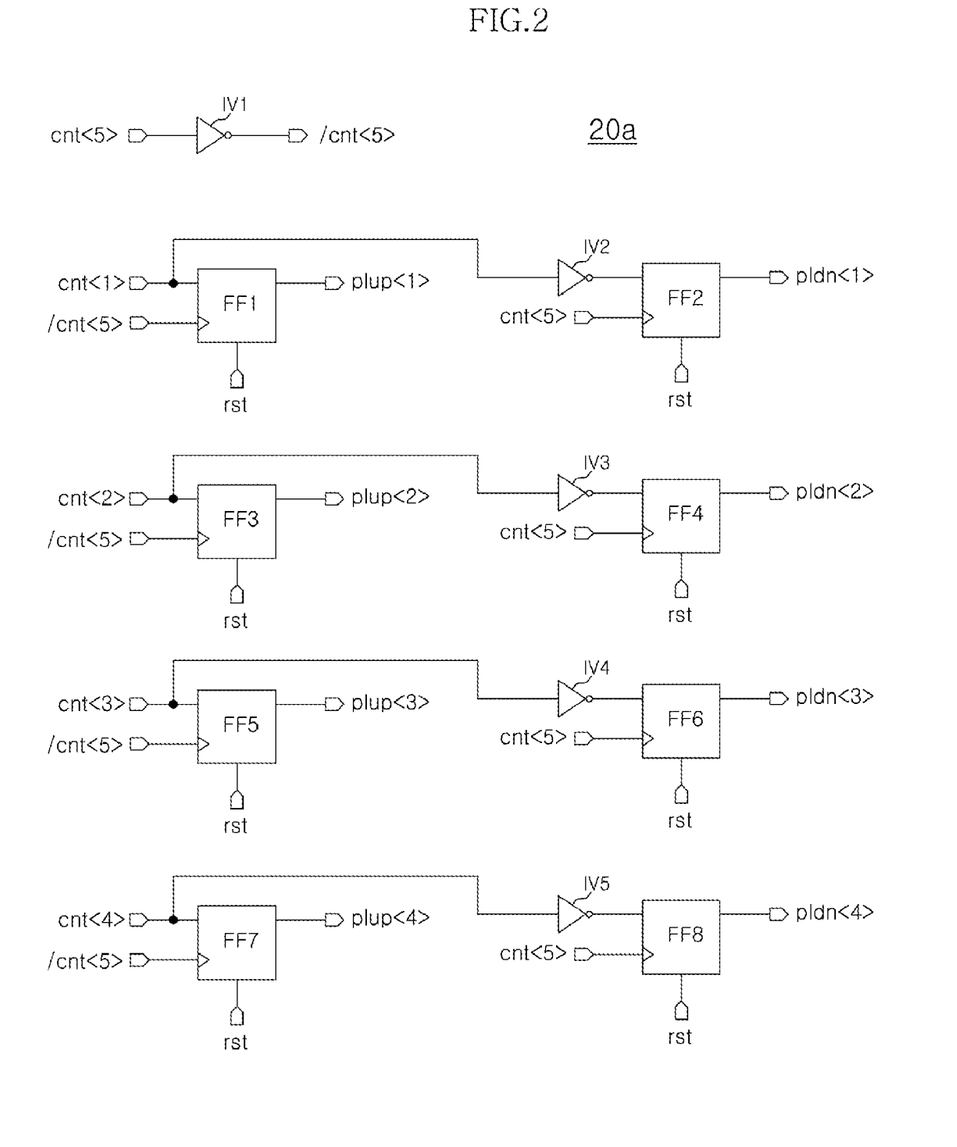
FIG. 2 is a schematic diagram of an exemplary decoding unit that can be included with the apparatus of FIG. 1 according to one embodiment.
Figure 3:
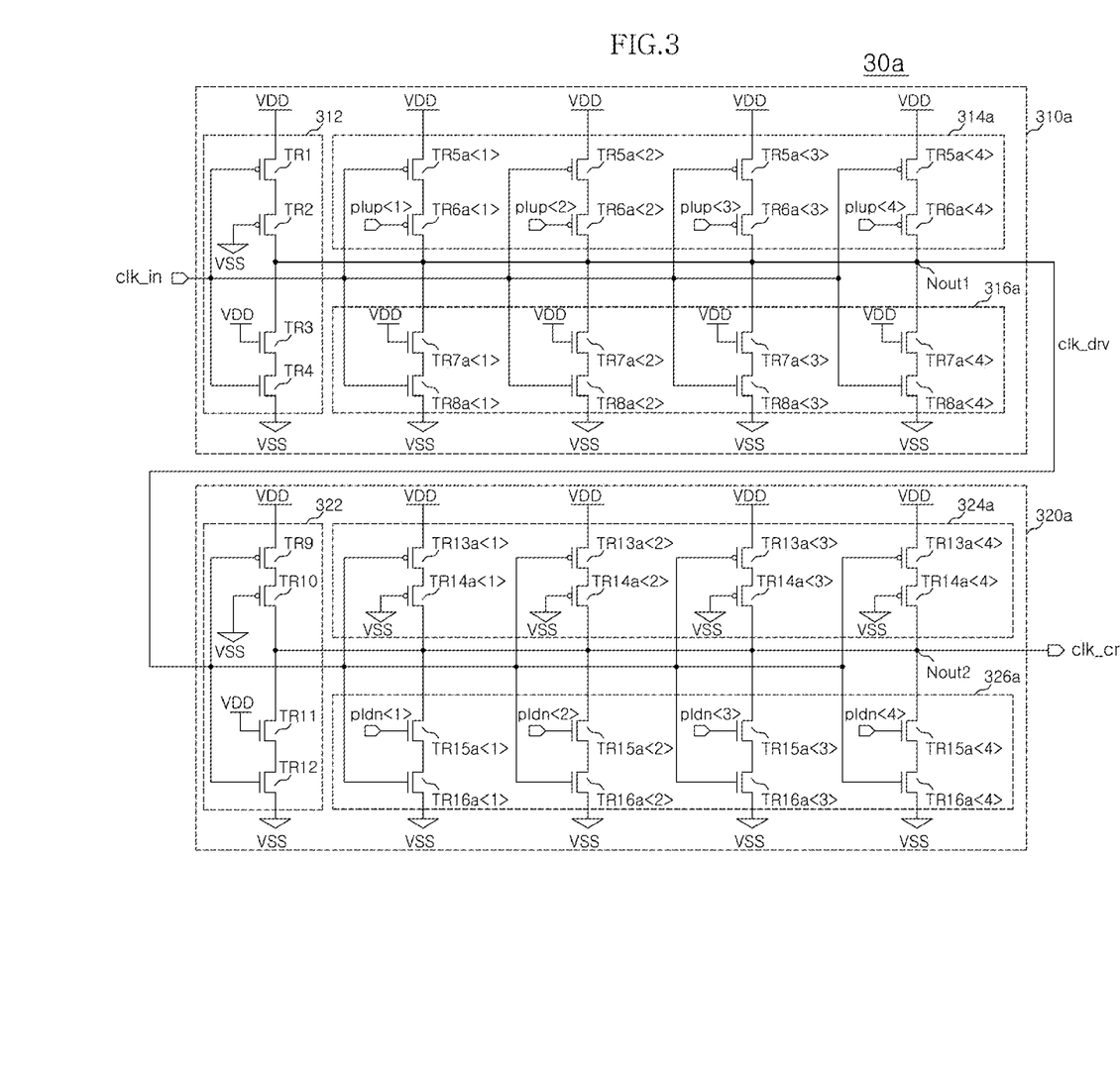
FIG. 3 is a schematic diagram of an exemplary duty ratio correcting unit that can be included with the apparatus of FIG. 1 according to one embodiment.

FIG. 2 is a schematic diagram of an exemplary decoding unit that can be included with the apparatus of FIG. 1 according to one embodiment, and FIG. 3 is a schematic diagram of an exemplary duty ratio correcting unit that can be included with the apparatus of FIG. 1 according to one embodiment. For purposes of explanation, that the variable "n" indicates that the number of n-bits of the various signals is 5. Hereinafter, a most significant bit of five bits of the counting signal 'cnt<1:5>' is represented as the counting signal 'cnt<1>' and a least significant bit thereof is represented as the counting signal 'cnt<5>'. In the same way, the most significant bits of the pull-up control signal 'plup<1:4>' and the pull-down control signal 'pldn<1:4>', each of which is implemented by 4-bits, are represented as the pull-up control signal 'plup<1>' and the pull-down control signal 'pldn<1>', respectively, and the least significant bits thereof are represented as the pull-up control signal 'plup<4>' and the pull-down control signal 'pldn'<4>', respectively.

As shown in FIG. 2, a decoding unit 20a can be configured to include first to eighth flip-flops FF1 to FF8 and first to fifth inverters IV1 to IV5. The first inverter IV1 can invert the counting signal 'cnt<5>' to generate a negative counting signal '/cnt<5>'.

The first flip-flop FF1 can be reset by a rest signal 'rst', and can latch the counting signal 'cnt<1>' in response to the negative counting signal '/cnt<5>' to generate the pull-up control signal 'plup<1>'. The second inverter IV2 can receive the counting signal 1 cnt<1>. The second flip-flop FF2 ca be reset by the reset signal 'rst', and can latch an output signal of the second inverter IV2 in response to the counting signal 'cnt<5>' to output the pull-down control signal 'pldn<1>'.

The third flip-flop FF3 can be reset by the reset signal 'rst', and can latch the counting signal 'cnt<2>' in response to the negative counting signal '/cnt<5>' to generate the pull-up control signal 'plup<2>'. The third inverter IV3 can receive the counting signal 'cnt<2>'.

The fourth flip-flop FF4 can reset by the reset signal 'rst', and can latch an output signal of the third inverter IV3 in response to the counting signal 'cnt<5>' to output the pull-down control signal 'pldn<2>'.

The fifth flip-flop FF5 can be reset by the reset signal 'rst', and can latch the counting signal 'cnt<3>' in response to the negative counting signal '/cnt<5>' to generate the pull-up control signal 'plup<3>'. The fourth inverter IV4 can receive the counting signal 'cnt<3>'.

The sixth flip-flop FF6 can be reset by the reset signal 'rst', and can latch an output signal of the fourth inverter IV4 in response to the counting signal 'cnt<5>' to output the pull-down control signal 'pldn<3>'.

The seventh flip-flop FF7 can be reset by the reset signal 'rst', and can latch the counting signal 'cnt<4>' in response to the negative signal '/cnt<5>' to generate the pull-up control signal 'plup<4>'. The fifth inverter IV5 can receive the counting signal 'cnt<4>'.

The eighth flip-flop FF8 can be reset by the reset signal 'rst', and can latch an output signal of the fifth inverter IV5 in response to the counting signal 'cnt<5>' to output the pull-down control signal 'pldn<4>'.

According to the decoding unit 20a, the logical value of the four bits of the pull-up control signal 'plup<1:4>' and the logical value of the four bits of the pull-down control signal 'pldn<1:4>' can alternately change. The changes in the logical values of the five bits of the counting signal 'cnt<1:5>', the four bits of the pull-up control signal 'plup<1:4>', and the four bits of the pull-down control signal 'pldn<1:4>' can be understood with reference to the following Table 1.

TABLE 1

| decimal | cnt<1:5> | plup<1> | plup<2> | plup<3> | plup<4> | pldn<1> | pldn<2> | pldn<3> | pldn<4> |
|---|---|---|---|---|---|---|---|---|---|
| 0 | 00000 | 0 | 0 | 0 | 0 | 1 | 1 | 1 | 1 |
| 1 | 00001 | 0 | 0 | 0 | 0 | 1 | 1 | 1 | 1 |
| 2 | 00010 | 0 | 0 | 0 | 1 | 1 | 1 | 1 | 1 |
| 3 | 00011 | 0 | 0 | 0 | 1 | 1 | 1 | 1 | 0 |
| 4 | 00100 | 0 | 0 | 1 | 0 | 1 | 1 | 1 | 0 |
| 5 | 00101 | 0 | 0 | 1 | 0 | 1 | 1 | 0 | 1 |
| 6 | 00110 | 0 | 0 | 1 | 1 | 1 | 1 | 0 | 1 |
| 7 | 00111 | 0 | 0 | 1 | 1 | 1 | 1 | 0 | 0 |
| 8 | 01000 | 0 | 1 | 0 | 0 | 1 | 1 | 0 | 0 |
| 9 | 01001 | 0 | 1 | 0 | 0 | 1 | 0 | 1 | 1 |
| 10 | 01010 | 0 | 1 | 0 | 1 | 1 | 0 | 1 | 1 |
| 11 | 01011 | 0 | 1 | 0 | 1 | 1 | 0 | 1 | 0 |
| 12 | 01100 | 0 | 1 | 1 | 0 | 1 | 0 | 1 | 0 |
| 13 | 01101 | 0 | 1 | 1 | 0 | 1 | 0 | 0 | 1 |
| 14 | 01110 | 0 | 1 | 1 | 1 | 1 | 0 | 0 | 1 |
| 15 | 01111 | 0 | 1 | 1 | 1 | 1 | 0 | 0 | 0 |
| 16 | 10000 | 1 | 0 | 0 | 0 | 1 | 0 | 0 | 0 |
| 17 | 10001 | 1 | 0 | 0 | 0 | 0 | 1 | 1 | 1 |
| 18 | 10010 | 1 | 0 | 0 | 1 | 0 | 1 | 1 | 1 |
| 19 | 10011 | 1 | 0 | 0 | 1 | 0 | 1 | 1 | 0 |
| 20 | 10100 | 1 | 0 | 1 | 0 | 0 | 1 | 1 | 0 |
| 21 | 10101 | 1 | 0 | 1 | 0 | 0 | 1 | 0 | 1 |
| 22 | 10110 | 1 | 0 | 1 | 1 | 0 | 1 | 0 | 1 |
| 23 | 10111 | 1 | 0 | 1 | 1 | 0 | 1 | 0 | 0 |
| 24 | 11000 | 1 | 1 | 0 | 0 | 0 | 1 | 0 | 0 |
| 25 | 11001 | 1 | 1 | 0 | 0 | 0 | 0 | 1 | 1 |
| 26 | 11010 | 1 | 1 | 0 | 1 | 0 | 0 | 1 | 1 |
| 27 | 11011 | 1 | 1 | 0 | 1 | 0 | 0 | 1 | 0 |
| 28 | 11100 | 1 | 1 | 1 | 0 | 0 | 0 | 1 | 0 |
| 29 | 11101 | 1 | 1 | 1 | 0 | 0 | 0 | 0 | 1 |
| 30 | 11110 | 1 | 1 | 1 | 1 | 0 | 0 | 0 | 1 |
| 31 | 11111 | 1 | 1 | 1 | 1 | 0 | 0 | 0 | 0 |

As represented by Table 1, when the logical value of the counting signal 'cnt<5>' that has the least significant bit of the five bits of the counting signal 'cnt<1:5>' is "0", the logical value of the four bits of the pull-up control signal 'plup<1:4>' can be increase by "1". When the logical value of the counting signal 'cnt<5>' is "1", the logical value of the four bits of the pull-down control signal 'pldn<1:4>' can be decrease by "1". That is, the decoding unit 20a can receive the five bits of the counting signal 'cnt<1:5>' to generate the four bits of the pull-up control signal 'plup<1:4>' and the four bits of the pull-down control signal 'pldn<1:4>'. Accordingly, the logical value of the four bits of the pull-up control signal 'plup<1:4>' and the logical value of the four bits of the pull-down control signal 'pldn<1:4>' can alternately change. Thus, if the logical value of the four bits of the pull-up control signal 'plup<1:4>' and the logical value of the four bits of the pull-down control signal 'pldn<1:4>' alternately change, then the duty ratio correcting unit 30 can prevent an erroneous operation due to an increase in a fan-out difference during the duty ratio correction operation, which will be described below again.

In FIG. 3, a duty ratio correcting unit 30a can include a first driver 310a and a second driver 320a. The first driver 310a can drive the input clock signal 'clk_in' in response to the four bits of the pull-up control signal 'plup<1:4>' to output a driving clock signal 'clk_drv'. Here, the first driver 310a can include a first output node (Nout1), a first default driver 312, a first pull-up section 314a, and a first pull-down section 316a. The first output node (Nout1) can output the driving clock clk_drv. In addition, the first default driver 312 can drive the input clock signal 'clk_in' and can transmit the input clock signal 'clk_in' to the first output node (Nout1).

The first default driver 312 can include first to fourth transistors TR1 to TR4. The first transistor TR1 can include a gate terminal that receives the input clock signal 'clk_in' and a source terminal that is supplied with an external voltage VDD. The second transistor TR2 can include a gate terminal that is supplied with a ground voltage VSS, a source terminal that is connected to a drain of the first transistor TR1, and a drain terminal that is connected to the first output node (Nout1). The third transistor TR3 can include a gate terminal that can be supplied with the external voltage VDD and a drain terminal that can be connected to the first output node (Nout1). The fourth transistor TR4 can include a gate terminal that can receive the input clock signal 'clk_in', a drain terminal that can be connected to a source terminal of the third transistor TR3, and a source terminal that can be connected to ground.

The first pull-up section 314a can pull-up a voltage level of the first output node (Nout1) in response to the input clock signal 'clk_in' and the four bits of the pull-up control signal 'plup<1:4>'. The first pull-up section 314a can include a four-grouping of fifth transistors TR5a<1:4> and a four-grouping of sixth transistors TR6a<1:4>.

In FIG. 3, each of the four-grouping of the fifth transistors TR5a<1:4> can include a gate terminal that receives the input clock signal 'clk_in' and a source terminal that can be supplied with the external voltage VDD. Each of the four-grouping of the sixth transistors TR6a<1:4> can include a gate terminal that can receive each of the four bits of the pull-up control signal 'plup<1:4>', a source terminal that can be connected to each of the drain terminals of the four-grouping of the fifth transistors TR5a<1:4>, and a drain terminal that can be connected to the first output node (Nout1).

The first pull-down section 316a can pull down a voltage level of the first output node (Nout1) in response to the external voltage VDD and the input clock signal 'clk_in'. The first pull-down section 316a can be configured to include a four-grouping of seventh transistors TR7a<1:4> and a four-grouping of eighth transistors TR8a<1:4>.

Each of the four-grouping of the seventh transistors TR7a<1:4> can include a gate terminal that can be supplied with the external voltage VDD and a drain terminal that can be connected to the first output node (Nout1). In addition, each of the four-grouping of the eighth transistors TR8a<1:4> can include a gate terminal that can receive the input clock signal 'clk_in', a drain terminal that can be connected to a source terminal of each of the four-grouping of the seventh transistors TR7a<1:4>, and a source terminal that can be connected to ground.

The second driver 320a can drive the driving clock signal 'clk_drv' in response to the four bits of the pull-down control signal 'pldn<1:4>' to generate the correction clock signal 'clk_crt'. In addition, the second driver 320a can include a second output node (Nout2), a second default driver 322, a second pull-up section 324a, and a second pull-down section 326a. The second output node (Nout2) can output the correction clock signal 'clk_crt'.

The second default driver 322 can drive the driving clock signal 'clk_drv' and can transmit the driving clock to the second output node (Nout2). The second default driver 322 can include a ninth to twelfth transistors TR9 to TR12.

The ninth transistor TR9 can include a gate terminal that can receive the driving clock signal 'clk_drv' and a source terminal that can be supplied with the external voltage VDD. The tenth transistor TR10 can include a gate terminal that can be supplied with the ground voltage VSS, a source terminal that can be connected to a drain terminal of the ninth transistor TR9, and a drain terminal that can be connected to the second output node (Nout2). The eleventh transistor TR11 can include a gate terminal that can be supplied with the external voltage VDD and a drain terminal that can be connected to the second output node (Nout2). The twelfth transistor TR12 can include a gate terminal that can receive the driving clock signal 'clk_drv', a drain terminal that can be connected to a source terminal of the eleventh transistor TR11, and a source terminal that can be connected to ground.

The second pull-up section 324a can pull up a voltage level of the second output node (Nout2) in response to the driving clock signal 'clk_drv' and the ground voltage VSS. In addition, the second pull-up section 324a can be configured to include a four-grouping of thirteenth transistors TR13a<1:4> and a four-grouping of fourteenth transistors TR14a<1:4>.

In FIG. 3, each of the four-grouping of the thirteenth transistors TR13a<1:4> can include a gate terminal that can receive the driving clock signal 'clk_drv' and a source terminal that can be supplied with the external voltage VDD. Each of the four-grouping of the fourteenth transistors TR14a<1:4> can include a gate terminal that can be supplied with the ground voltage VSS, a source terminal that can be connected to each of drain terminals of the four-grouping of the thirteenth transistors TR13a<1:4>, and a drain terminal that can be connected to the second output node (Nout2).

The second pull-down section 326a can pull down a voltage level of the second output node (Nout2) in response to the four bits of the pull-down control signal 'pldn<1:4>' and the driving clock signal 'clk_drv'. In addition, the second pull-down section 326a can be configured to include a four-grouping of fifteenth transistors TR15a<1:4> and a four-grouping of sixteenth transistors TR16a<1:4>.

In FIG. 3, each of the four-grouping of the fifteenth transistors TR15a<1:4> can include a gate terminal that can be supplied with the external voltage VDD and a drain terminal that can be connected to the second output node (Nout2). Each of the four-grouping of the sixteenth transistors TR16a<1:4> can include a gate terminal that can receive the driving clock signal 'clk_drv', a drain terminal that can be connected to each source terminal of the four-grouping of the fifteenth transistors TR15a<1:4>, and a source terminal that can be connected to ground.

In the duty ratio correcting unit 30a having the exemplary structure detailed above, if the logical values of the four bits of the pull-up control signal 'plup<1:4>' and the four bits of the pull-down control signal 'pldn<1:4>' are as shown in Table 1, a low level interval can be wider than a high level interval at the initial waveform of the correction clock signal 'clk_crt'. Then, as the logical values of the four bits of the pull-up control signal 'plup<1:4>' and the four bits of the pull-down control signal 'pldn<1:4>' sequentially change, a driving ability of the first pull-up section 314a of the first driver 310a and a driving ability of the second pull-down section 326a of the second driver 320a can be alternately reduced, which can result in narrowing the low level interval of the correction clock signal 'clk_crt'. If the low level interval of the correction clock signal 'clk_crt' is not significantly wider than the high level interval thereof, then the driving ability of the first pull-up section 314a of the first driver 310a and the driving ability of the second pull-down section 326a of the second driver 320a can be locked.

Figure 4:
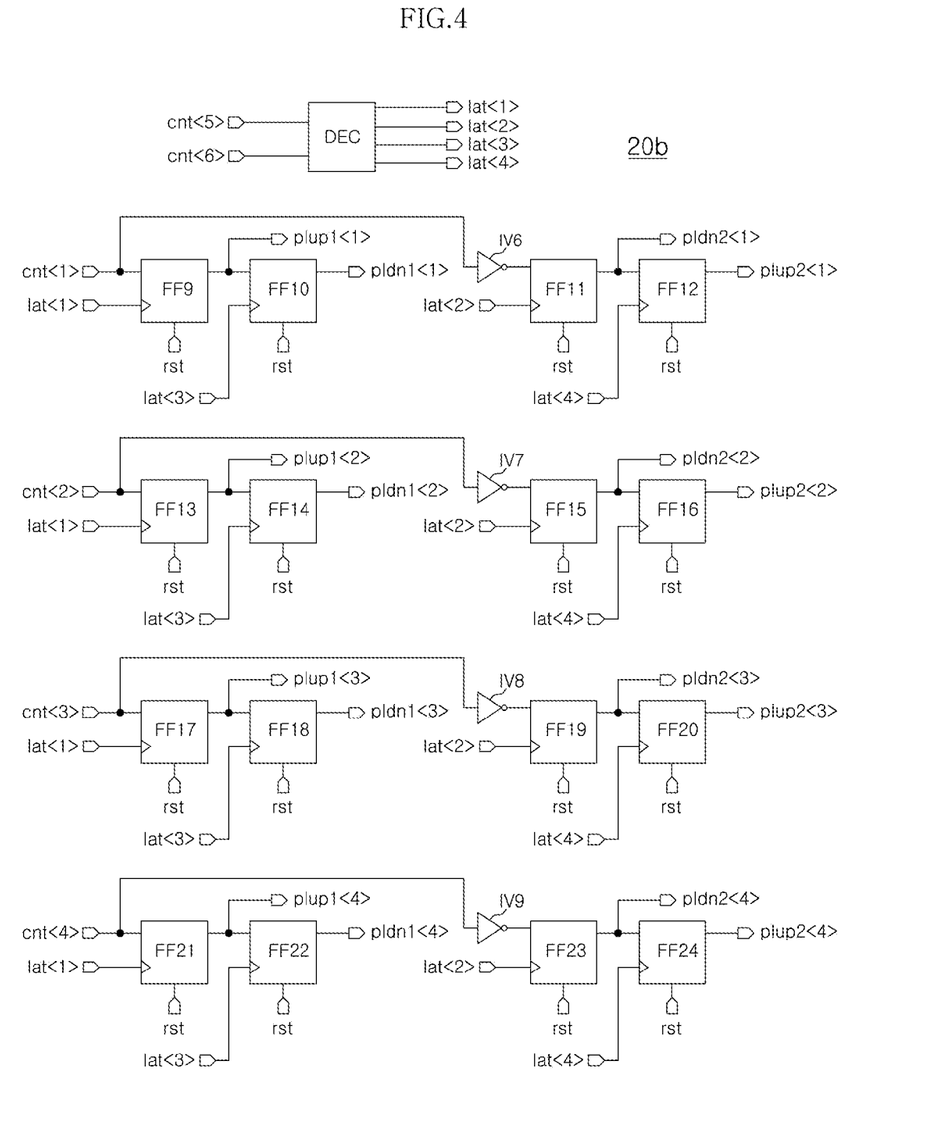
FIG. 4 is a schematic diagram of another exemplary decoding unit that can be used in the apparatus of FIG. 1 according to another embodiment.
Figure 5:
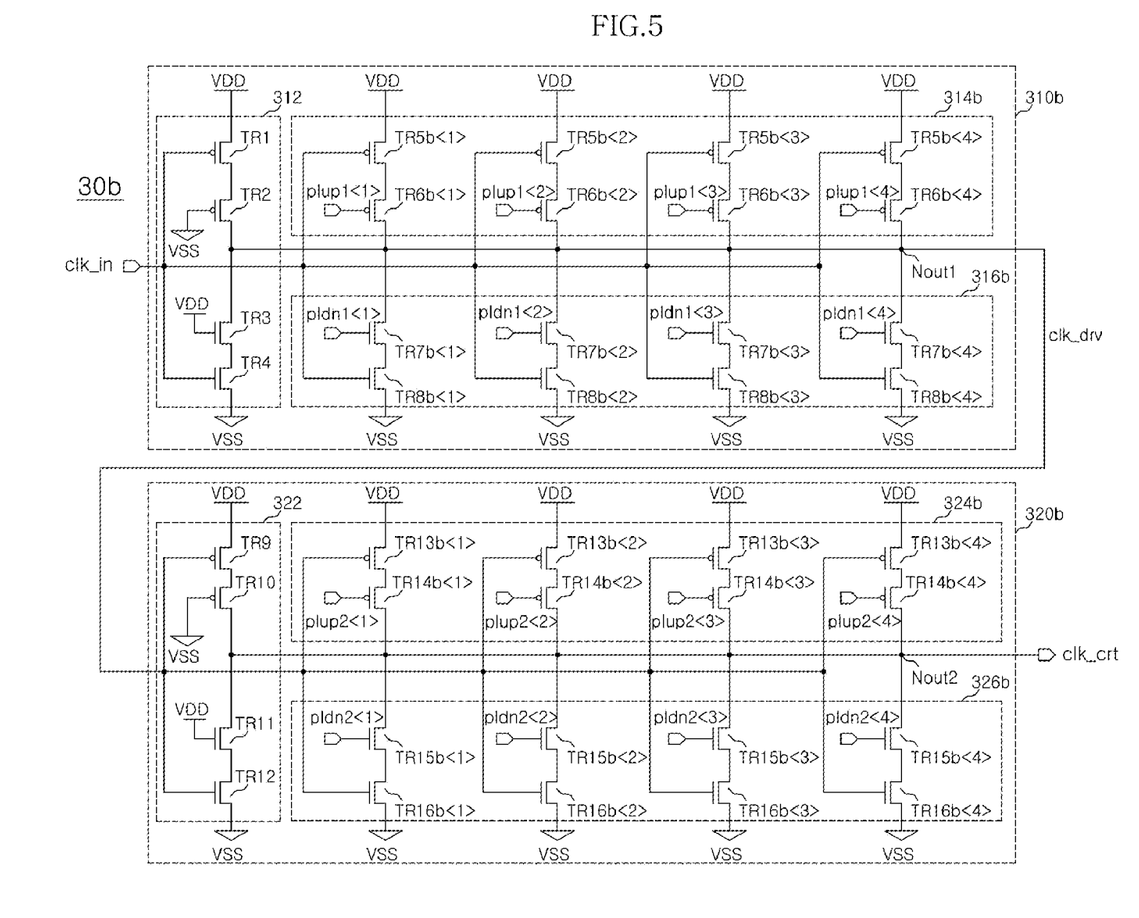
FIG. 5 is a schematic diagram of another exemplary duty ratio correcting unit that can be used in the apparatus of FIG. 1 according to another embodiment.

FIG. 4 is a schematic diagram of another exemplary decoding unit that can be used in the apparatus of FIG. 1 according to another embodiment, and FIG. 5 is a schematic diagram of another exemplary duty ratio correcting unit that can be used in the apparatus of FIG. 1 according to another embodiment. In FIGS. 4 and 5, each of the pull-up control signal 'plup' and the pull-down control signal 'pldn' can be implemented by four bits. In addition, the pull-up control signal 'plup' can include a first pull-up control signal 'plup1<1:4>' and a second pull-up control signal 'plup2<1:4>'. Similarly, the pull-down control signal 'pldn' can include a first pull-down control signal 'pldn1<1:4>' and a second pull-down control signal 'pldn2<1:4>'. Accordingly, the counting signal 'cnt<1:n>' can be implemented by six bits of a signal in which a most significant bit can be represented as a counting signal 'cnt<1:n>' and a least significant bit can be represented as a counting signal 'cnt<6>'.

In FIG. 4, the decoding unit 20b can be configured to include a decoder DEC, ninth to twenty-fourth flip-flops FF9 to FF24, and sixth to ninth inverters IV6 to IV9.

The decoder DEC can decode the counting signal 'cnt<5>' and the counting signal 'cnt<6>' to generate first to fourth latch control signals 'lat<1:4>'. The first to fourth latch control signals 'lat<1:4>' can be sequentially enabled in accordance with changes in the logical value of the counting signal 'cnt<1:6>'.

The ninth flip-flop FF9 can be reset by a reset signal 'rst', and can latch the counting signal 'cnt<1>' in response to the first latch control signal 'lat<1>' to generate a first pull-up control signal 'plup1<1>'. The tenth flip-flop FF10 can be reset by the reset signal 'rst', and can generate the first pull-up control signal 'plup1<1>' in response to the third latch control signal 'lat<3>'. The sixth inverter IV6 can receive the counting signal 'cnt<1>'. The eleventh flip-flop FF11 can be reset by the reset signal 'rst', and can latch an output signal of the sixth inverter IV6 in response to the second latch control signal 'lat<2>' to output a second pull-down control signal 'pldn2<1>'. The twelfth flip-flop FF12 can be reset by the reset signal 'rst', and can latch the second pull-down control signal 'pldn2<1>' in response to the fourth latch control signal 'lat<4>' to output a second pull-up control signal 'plup2<1>'.

The thirteenth flip-flop FF13 can be reset by the reset signal 'rst', and can latch the counting signal 'cnt<2>' in response to the first latch control signal 'lat<1>' to generate a first pull-up control signal 'plup1<2>'. The fourteenth flip-flop FF14 can be reset by the reset signal 'rst', and can generate the first pull-up control signal 'plup1<2>' in response to the third latch control signal 'lat<3>'. The seventh inverter IV7 can receive the counting signal 'cnt<2>'. The fifteenth flip-flop FF15 can be reset by the reset signal 'rst', and can latch an output signal of the seventh inverter IV7 in response to the second latch control signal 'lat<2>' to output a second pull-down control signal 'pldn2<2>'. The sixteenth flip-flop FF16 can be reset by the reset signal 'rst', and can latch the second pull-down control signal 'pldn2<2>' in response to the fourth latch control signal 'lat<4>' to output a second pull-up control signal 'plup2<2>'.

The seventeenth flip-flop FF17 can be reset by the reset signal 'rst', and can latch the counting signal 'cnt<3>' in response to the first latch control signal 'lat<1>' to generate a first pull-up control signal 'plup1<3>'. The eighteenth flip-flop FF18 can be reset by the reset signal 'rst', and can generate the first pull-up control signal 'plup1<3>' in response to the third latch control signal 'lat<3>'. The eighth inverter IV8 can receive the counting signal 'cnt<3>'. The nineteenth flip-flop FF19 can be reset by the reset signal 'rst', and can latch an output signal of the eighth inverter IV8 in response to the second latch control signal 'lat<2>' to output a second pull-down control signal 'pldn2<3>'. The twentieth flip-flop FF20 can be reset by the reset signal 'rst', and can latch the second pull-down control signal 'pldn2<3>' in response to the fourth latch control signal 'lat<4>' to output a second pull-up control signal 'plup2<3>'.

The twenty-first flip-flop FF21 can be reset by the reset signal 'rst', and can latch the counting signal 'cnt<4>' in response to the first latch control signal 'lat<1>' to generate a first pull-up control signal 'plup1<4>'. The twenty-second flip-flop FF22 can be reset by the reset signal 'rst', and can generate the first pull-up control signal 'plup1<4>' in response to the third latch control signal 'lat<3>'. The ninth inverter IV9 can receive the counting signal 'cnt<4>'. The twenty-third flip-flop FF23 can be reset by the reset signal 'rst', and can latch an output signal of the ninth inverter IV9 in response to the second latch control signal 'lat<2>' to output a second pull-down control signal 'pldn2<4>'. The twenty-fourth flip-flop FF24 can be reset by the reset signal 'rst', and can latch the second pull-down control signal 'pldn2<4>' in response to the fourth latch control signal 'lat<4> ' to output a second pull-up control signal 'plup2<4>'.

According to the exemplary structure of the decoding unit 20b, the two lower bits among the six bits of the counting signal 'cnt<1:6>' can be used when selecting a signal whose logical value is changed among the first pull-up control signal 'plup1<1:4>', the first pull-down control signal 'pldn1<1:4>', the second pull-up control signal 'plup2<1:4>', and the second pull-down control signal 'pldn2<1:4>'. The first pull-up control signal 'plup1<1:4>' and the first pull-down control signal 'pldn1<1:4>' can be implemented such that their logical values can be the same at the initial waveform and can increase by "1". In addition, the second pull-up control signal 'plup2<1:4>' and the second pull-down control signal 'pldn2<1:4>' can be implemented such that their logical values can be the same at the initial waveform and can decrease by "1". Accordingly, when the logical values of the two lower bits among the six bits of the counting signal 'cnt<1:6>' change, in the order of the first pull-up control signal 'plup1<1:4>', the second pull-down control signal 'pldn2<1:4>', the first pull-down control signal 'pldn1<1:4>', and the second pull-up control signal 'plup2<1:4>', their logical values can change.

In FIG. 5, the duty ratio correcting unit 30b can be configured to be substantially similar to the configuration of the duty ratio correcting unit 30a shown in FIG. 3. However, the duty ratio correcting unit 30b can be different from the duty ratio correcting unit 30a in that a driving ability of a first pull-up section 314b of a first driver 310b can change in response to the first pull-up control signal 'plup1<1:4>', a driving ability of a first pull-down section 316b can change in response to the first pull-down control signal 'pldn1<1:4>', a driving ability of a second pull-up section 324b of a second driver 320b can change in response to the second pull-up control signal 'plup2<1:4>', and a driving ability of a second pull-down section 326b can change in response to the second pull-down control signal 'pldn2<1:4>'.

The first pull-up section 314b can include a four-grouping of fifth transistors TR5b<1:4> and a four-grouping of sixth transistors TR6b<1:4>. Each of the four-grouping of the fifth transistors TR5b<1:4> can include a gate terminal that can receive the input clock signal 'clk_in' and a source terminal that can be supplied with the external voltage VDD. Each of the four-grouping of the sixth transistors TR6b<1:4> can include a gate terminal that can receive each of the four bits of a first pull-up control signal 'plup1<1:4>', a source terminal that can be connected to each drain terminals of the four fifth transistors TR5b<1:4>, and a drain terminal that can be connected to the first output node (Nout1). The first pull-down section 316b can be configured to include a four-grouping of seventh transistors TR7b<1:4> and a four-grouping of eighth transistors TR8b<1:4>. Each of the four-grouping of the seventh transistors TR7b<1:4> can include a gate terminal that can receive each of the four bits of a first pull-down control signal 'pldn1<1:4>' and a drain terminal that can be connected to the first output node (Nout1). Each of the four-grouping of the eighth transistors TR8b<1:4> can include a gate terminal that can receive the input clock signal 'clk_in', a drain terminal that can be connected to each source terminal of the four-grouping of the seventh transistors TR7b<1:4>, and a source terminal that can be connected to ground.

The second pull-up section 324b can be configured to include a four-grouping of thirteenth transistors TR13b<1:4> and a four-grouping of fourteenth transistors TR14b<1:4>. Each of the four-grouping of the thirteenth transistors TR13b<1:4> can include a gate terminal that can receive the driving clock signal 'clk_drv' and a source terminal that can be supplied with the external voltage VDD. Each of the four-grouping of the fourteenth transistors TR14b<1:4> can include a gate terminal that can receive each of the four bits of a second pull-up control signal 'plup2<1:4>', a source terminal that can be connected to each drain terminal of the four-grouping of the thirteenth transistors TR13b<1:4>, and a drain terminal that can be connected to the second output node (Nout2).

The second pull-down section 326b can be configured to include a four-grouping of fifteenth transistors TR15b<1:4> and a four-grouping of sixteenth transistors TR16b<1:4>. Each of the four-grouping of the fifteenth transistors TR15b<1:4> can include a gate terminal that can receive each of the four bits of a second pull-down control signal 'pldn2<1:4>' and a source terminal that can be connected to the second output node (Nout2). Each of the four-grouping of the sixteenth transistors TR16b<1:4> can include a gate terminal that can receive the driving clock signal 'clk_drv', a drain terminal that can be connected to each source terminal of the four-grouping of the fifteenth transistors TR15b<1:4>, and a source terminal that can be connected to ground.

When the logical values of the first pull-up control signal 'plup<1:4>', the second pull-down control signal 'pldn2<1:4>', the first pull-down control signal 'pldn1<1:4>', and the second pull-up control signal 'plup2<1:4>' alternately change one bit by one bit, in the order of the first pull-up section 314 of the first driver 310, the second pull-down section 326 of the second driver 320, the first pull-down section 316 of the first driver 310, and the second pull-up section 324 of the second driver 320, the driving abilities thereof can change. Accordingly, the duty ratio correcting unit 30b can gradually narrow the low level interval of the correction clock signal 'clk_crt', thereby correcting a duty ratio. Thus, an elaborated duty ratio correction operation can be performed, as compared to the configurations shown in FIGS. 2 and 3.

As described above, in a duty cycle correcting circuit and method of correcting a duty cycle, a duty cycle of an input clock signal can be corrected using multi-stage drivers while driving abilities of the drivers can alternately change, thereby preventing erroneous operations from occurring due to an increase in a fan-out difference between the drivers. Thus, by using the lower bits to distinguish the drivers from each other in decoding the counting signal whose logical value increase by "1", operational stability of a duty cycle correcting circuit can be improved and duty cycle corrections can be stably performed.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A duty cycle correcting circuit, comprising:
   a first driver including a plurality of first driving units and a plurality of first control units, wherein
      one of the plurality of the first driving units includes a first pull-up device and a first pull-down device that are driven in response to an input clock signal,
      one of the plurality of the first control units is connected between the first pull-up device and the first pull-down device, and
      the one of the first control units includes a first auxiliary pull-up device and a first auxiliary pull down device that are selectively driven in response to a first pull-up control signal and a first pull-down control signal, respectively; and
   a second driver including a plurality of second driving units and a plurality of second control units, wherein
      one of the plurality of the second driving units includes a second pull-up device and a second pull-down device that are driven in response to an output signal of the first driver,
      one of the plurality of the second control units is connected between the second pull-up device and the second pull-down device, and
      the one of the second control units includes a second auxiliary pull-up device and a second auxiliary pull-down device that are selectively driven in response to a second pull-up control signal and a second pull-down control signal, respectively,
   wherein logical values of the first pull-up control signal and the first pull-down control signal are alternately changed in response to a duty ratio detecting signal, and logical values of the second pull-up control signal and the second pull-down control signal are alternately changed in response to the duty ratio detecting signal.

2. The duty cycle correcting circuit of claim 1, further comprising a duty ratio control unit configured to generate a plurality of bits of the first pull-up and pull-down control signals and a plurality of bits of the second pull-up and pull-down control signals.

3. The duty cycle correcting circuit of claim 2, wherein the duty ratio control unit includes:
   a counting unit configured to generate a plurality of bits of a counting signal in response to the duty ratio detection signal; and a decoding unit configured to decode the plurality of bits of the counting signal to generate the plurality of bits of the first pull-up and pull-down control signals and the plurality of bits of the second pull-up and pull-down control signals.

4. The duty cycle correcting circuit of claim 3, wherein the counting unit is configured to increase a logical value of the plurality of bits of the counting signal when the duty ratio detection signal is enabled, and to lock the logical value of the plurality of bits of the counting signal when the duty ratio detection signal is disabled.

5. The duty cycle correcting circuit of claim 3, wherein the decoding unit is configured to change the logical value of one of the plurality of bits of the first pull-up and pull-down control signals and the plurality of bits of the second up and pull-down control signals in accordance with a logical value of a least significant bit of the plurality of the bits of the counting signal so as to mutually compensate a driving ability of the first driver and a driving ability of the second driver.

6. The duty cycle correcting circuit of claim 1, wherein a driving ability of the first driver and the driving ability of the second driver alternately increase.

7. The duty cycle correcting circuit of claim 1, wherein the first driver further comprises:
a default driver configured to drive the input clock signal to transmit the driven input clock signal to the plurality of the first driving units.

8. The duty cycle correcting circuit of claim 1, wherein the second driver further comprises:
a default driver configured to drive the output signal of the first driver to transmit the driven output signal to the plurality of the second driving units.

9. The duty cycle correcting circuit of claim 2, further comprising:
a duty ratio detecting unit configured to detect a duty ratio of a correction clock to generate the duty ratio detection signal.

10. The duty cycle correcting circuit of claim 9, wherein the duty ratio detecting unit is configured to maintain an enabled state of the duty ratio detection signal when a first level interval of the correction clock signal is wider than a second level interval thereof, and to disable the duty ratio detection signal when the first level interval is not wider than the second level interval.

11. The duty cycle correcting circuit of claim 3, wherein the decoding unit is configured to determine a logical value of two lower bits of the plurality of bits of the counting signal, and to alternately change the logical values of the first pull-up control signal, the second pull-down control signal, the first pull-down control signal, and the second pull-up control signal in a predetermined unit in accordance with the determined logical value.

12. A duty cycle correcting circuit, comprising:
a counting unit configured to generate a plurality of bits of a counting signal whose logical value increases;
a decoding unit configured to change a logical value of one of a plurality of bits of a pull-up control signal and a plurality of bits of a pull-down control signal in accordance with a logical value of a least significant bit of the plurality of bits of the counting signal; and a duty ratio correcting unit configured to adjust driving abilities of a first driver and a second driver in response to the plurality of bits of the pull-up control signal and the plurality of bits of the pull-down control signal to output a correction clock signal,
wherein the first driver includes a first default driver configured to receive an input clock, and a plurality of driving units configured to be connected in parallel with the first default driver, and the second driver includes a second default driver configured to receive an output signal of the first driver and a plurality of driving units configured to be connected in parallel with the second default driver,
wherein the pull-up control signal includes a first pull-up control signal of the first driver and a second pull-up control signal of the second driver, and the pull-down control signal includes a first pull-down control signal of the first driver and a second pull-down control signal of the second driver,
wherein the first pull-up control signal is changed or locked when the first pull-down control signal is locked or changed,
wherein the second pull-up control signal is changed or locked when the second pull-down control signal is locked or changed, and
wherein a driving ability of the first driver and the driving ability of the second driver alternately increase.

13. The duty cycle correcting circuit of claim 1, wherein the first pull-up control signal is changed and the first pull-down control signal is locked,
wherein the second pull-up control signal is locked and the second pull-down control signal is changed, and
wherein the logical value of one of the first pull-up control signal and the second pull-up control signal is selectively and alternately changed.

14. A duty cycle correcting circuit, comprising:
a first driver including
a plurality of first driving units, one of the plurality of first driving units including a first pull-up device and a first pull-down device that are driven in response to an input clock signal, and
a first control unit connected between the first pull-up device and the first pull-down device, the first control unit including an auxiliary first pull-up device and an auxiliary first pull-down device that are selectively driven in response to a first pull-up control signal and a first pull-down control signal, respectively; and
a second driver including
a plurality of second driving units, one of the plurality of second driving units including a second pull-up device and a second pull-down device that are driven in response to an output signal of the first driver, and
a second control unit connected between the second pull-up device and the second pull-down device, the second control unit including a second auxiliary pull-up device and a second auxiliary pull-down device that are selectively driven in response to a second pull-up control signal and a second pull-down control signal, respectively.

* * * * *